US009336346B2

(12) United States Patent
Herberholz

(10) Patent No.: US 9,336,346 B2
(45) Date of Patent: May 10, 2016

(54) INTEGRAL FABRICATION OF ASYMMETRIC CMOS TRANSISTORS FOR AUTONOMOUS WIRELESS STATE RADIOS AND SENSOR/ACTUATOR NODES

(71) Applicant: QUALCOMM TECHNOLOGIES INTERNATIONAL, LTD., Cambridge (GB)

(72) Inventor: Rainer Herberholz, Cambridge (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 291 days.

(21) Appl. No.: 14/168,665

(22) Filed: Jan. 30, 2014

(65) Prior Publication Data

US 2015/0213180 A1    Jul. 30, 2015

(51) Int. Cl.
*H01L 21/8238* (2006.01)
*G06F 17/50* (2006.01)
*H01L 23/00* (2006.01)

(52) U.S. Cl.
CPC ............ *G06F 17/5072* (2013.01); *H01L 23/00* (2013.01)

(58) Field of Classification Search
CPC ............ H01L 29/1083; H01L 29/7835; H01L 29/66659; H01L 29/66537; H01L 21/823418; H01L 27/092
USPC ........................................................ 438/199
See application file for complete search history.

(56) References Cited

U.S. PATENT DOCUMENTS

| 5,650,340 | A | * | 7/1997 | Burr | H01L 29/1045 257/E21.427 |
|---|---|---|---|---|---|
| 5,744,372 | A | * | 4/1998 | Bulucea | H01L 21/823807 257/E21.427 |
| 6,466,489 | B1 | * | 10/2002 | Ieong | G11C 5/045 257/404 |
| 2001/0019869 | A1 | * | 9/2001 | Hsu | H01L 21/26586 438/286 |
| 2006/0261417 | A1 | * | 11/2006 | Suzuki | H01L 27/0207 257/370 |
| 2007/0138592 | A1 | | 6/2007 | Chang et al. | |
| 2010/0285650 | A1 | | 11/2010 | Shi et al. | |

OTHER PUBLICATIONS

Search Report issued for Great Brittan Patent Application No.: GB1414909.0, dated Jul. 9, 2015, 3 pages.

* cited by examiner

*Primary Examiner* — Trung Q Dang
(74) *Attorney, Agent, or Firm* — Procopio, Cory, Hargreaves & Savitch LLP

(57) ABSTRACT

A method of arranging asymmetrically doped CMOS transistors in a semiconductor wafer that forms base cells within a plurality of logic standard cells in a CMOS process technology that includes conventional symmetric CMOS transistors having different threshold voltages. The asymmetrically doped CMOS transistors have a gate length exceeding 1.5 times the minimum gate length of the symmetric CMOS transistors. Regions defined by electrical junctions directly adjacent to the gate of the asymmetric transistors are formed by an implant mask exposing an area of the wafer on the source side of the transistor to receive the junction implant of the symmetric CMOS transistors with a higher threshold voltage while shielding the drain area, and a further implant mask exposing an area of the wafer on the drain side of the transistor to receive the junction implant of the symmetric CMOS transistors with a lower threshold voltage while shielding the source area.

4 Claims, 5 Drawing Sheets

INTEGRAL FABRICATION OF ASYMMETRIC CMOS TRANSISTORS FOR AUTONOMOUS WIRELESS STATE RADIOS AND SENSOR/ACTUATOR NODES

TECHNICAL FIELD

The present disclosure relates to logic circuits constructed from asymmetrically doped complementary metal-oxide-semiconductor (CMOS) transistors. It is particularly related to, but in no way limited to, CMOS transistors used for autonomous wireless state radios and sensor actuator nodes.

BACKGROUND

Autonomous wireless state radios and sensor/actuator systems may be characterised by having no local user interfaces and are often required to be Always-ON. Always-ON in this context is characterised by long periods of standby (more than 99% of the time) with short bursts of activity, during which, for example, a transmission is made and/or measurements are taken or actuators operated.

During standby, certain system functions have to be maintained. This critically involves, for example, scheduling of the next transmission and maintaining state information, but may also include continuous sensing.

Advances in low power CMOS process technology have been driven by mobile computing applications and such systems directly benefit from improved fabrication technologies. In many cases the use of advanced CMOS technology is necessary in order to support the active function of a CMOS system within the power limitations of single battery cells or energy harvesters.

Advances in CMOS transistor technology have reduced the power required for both logic operations as well as the active power consumption of the analogue parts of a radio or sensor fabricated using such technology. FIG. 1 illustrates the power consumed by a CMOS circuit in standby and transmission modes for transistors fabricated using conventional (older) and advanced (newer) CMOS transistor technology. FIG. 1 indicates that the peak power consumption during logic operations in the ON-state is reduced in circuits fabricated using advanced CMOS transistor technology when compared to conventional CMOS fabrication technology. FIG. 1 also shows that the static power consumption of CMOS circuits using advanced CMOS transistor fabrication technology in the standby or OFF-state is higher than in the case of CMOS circuits fabricated using conventional CMOS fabrication technology, as this is dominated by leakage power which is typically higher when using advanced CMOS transistor fabrication technology.

We distinguish different operating states of the system:
Active: Key processing blocks are powered-up and operate at high clock frequency. Typically active power consumption dominates.
Sleep: Most circuitry powered off, with a small subset of "Always-ON" circuitry clocked at low clock frequency and powered with reduced supply voltage, providing a keep-alive function and scheduling active operation. Typically static power consumption dominates over the active switching power in this case.
Due to higher static power consumption, the average power consumption can be dominated by the leakage power consumed by circuits that remain powered during the sleep. This is seen by the higher average power consumption in FIG. 1 for circuits fabricated using advanced CMOS technology compared to those fabricated using conventional CMOS technology.

CMOS circuits for certain types of device can be split into blocks of Always-ON circuitry and blocks which are powered only during Active operation. The Always-ON logic circuitry represents a fraction of the total standard cell area, for which low leakage is the single most important requirement. These blocks conventionally use devices with a high threshold voltage (HVT), and are responsible for the higher power consumption in the sleep state as seen in FIG. 1.

The blocks powered up during Active operation are usually optimised for speed and low dynamic power and contain higher performance devices with lower threshold voltage (LVT).

An inverter is a representative of a functional building block implementing a logic function. It is widely known in the art of circuit design that an inverter comprises NMOS and PMOS transistors connected in series with tied inputs. There are two distinct leakage mechanisms at work in an inverter:
Transistors in the OFF state (VGS=0, VDS=VDD):
The drain off-current divides into sub-threshold current to the source, bulk leakage current and gate leakage current.
Transistors in the ON state (VGS=VDD, VDS=0):
In this case leakage current is due to tunnelling currents between the channel and the gate.

In addition to the above, FIG. 2 shows the variation of drain leakage current Id(off) and bulk leakage current Ib(HVT) in the OFF-state of an HVT transistor exemplified by an NMOS transistor with a gate length L of 0.09 µm. The bulk OFF-state current Ib(LVT) of a corresponding LVT NMOS transistor is also shown in the figure for comparison. It is clear from FIG. 2 that the bulk leakage current in the HVT transistors must be reduced in order to achieve a further reduction of the total device leakage current.

HVT transistors fabricated using advanced CMOS fabrication technology typically use high dose pocket and extension implants with the aim of reducing short channel effects and sub-threshold leakage currents. However, the resulting highly doped, abrupt junctions cause significant junction leakage. A further reduction in the sub-threshold leakage currents can be achieved by increasing the gate length L above the minimum gate length Lmin defined for the advanced CMOS fabrication technology being used. However, the junction leakage of the drain junction must be reduced in order to allow a reduction of the overall leakage. Finally, ON-state gate leakage sets a total leakage current floor depending on the supply voltage.

There therefore remains a need of further reducing the total leakage current and supply voltage in CMOS devices used in Always-ON circuits and facilitating the use of such devices in logic standard cells without adding complexities to current state of the art CMOS fabrication technology.

SUMMARY OF THE INVENTION

This invention relates to a CMOS transistor framework to minimize static power dissipation in logic circuits. In particular, the invention describes a method of arranging asymmetrically doped CMOS transistors into building blocks for logic standard cells. A method of fabrication thereof is also detailed.

There is therefore provided a method of arranging asymmetrically doped CMOS transistors in a semiconductor wafer, said method of arrangement forming base cells within a plurality of logic standard cells in a CMOS process technology comprising conventional, symmetric CMOS transistors having different threshold voltages distinguished by junction implants forming the electrical junctions directly adjacent to the gate; said asymmetrically doped CMOS transistors having a gate length exceeding 1.5 times the minimum gate length of the symmetric CMOS transistors, whereby the regions defined by the electrical junctions directly adjacent to the gate of the asymmetric transistors are formed by: (i) an implant mask from a plurality of implant masks that exposes an area of the wafer on the source side of the transistor to receive the junction implant of the symmetric CMOS transistors with higher threshold voltage while shielding the drain area, and (ii) a further implant mask from said plurality of implant masks that exposes an area of the wafer on the drain side of the transistor to receive the junction implant of the symmetric CMOS transistors with lower threshold voltage while shielding the source area; said asymmetrical transistors being arranged into base cells such that patterns for source and drain regions formed on the relevant implant masks form a regular array which is achieved by mirroring adjacent base cells such that like regions of source or drain are directly adjacent for each pair of base cells; wherein each base cell contains exactly one asymmetric NMOS transistor and one asymmetric PMOS transistor, each formed on an individual active area, such that the gate and vertical position of the active area are aligned between said NMOS and PMOS transistors and such that the edges of the relevant implant masks forming each of the electrical junctions adjacent to the gate are aligned with the centre of the gate.

There is further provided base cells, wherein the area of the implant patterns that define the junction implants directly adjacent to the transistor gate exceeds 50% of the minimum area required for a viable implant in the CMOS process technology.

Also provided is a plurality of base cells with identical implant patterns differing only by the width of the NMOS and PMOS transistors as well as by the configuration of the gate connection.

A pair of tap cells is also provided, said pair of tap cells having the same size and type of implant opening for the implant defining the transistor junctions directly adjacent to the asymmetric transistor gates, wherein one of the pair of tap cells is used for the source side, and the other of the pair of tap cells is used for the drain side, said pair of tap cells containing a source-drain implant of opposite type to that of the junction directly adjacent to the transistor gate and forming an ohmic connection to the transistor bulk.

DETAILED DESCRIPTION

Figure 1:
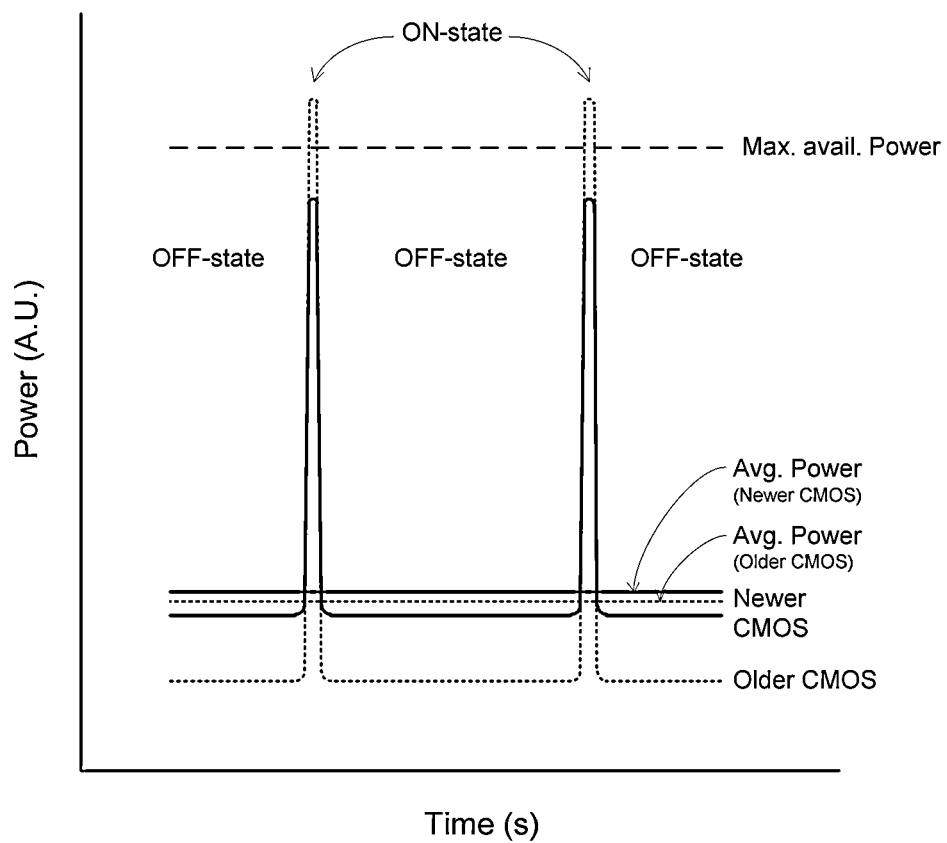
FIG. 1 illustrates the power consumption in the Active operation and Sleep-state of circuits using transistors fabricated using conventional and advanced CMOS fabrication technology, FIG. 2 charts the drain and bulk current in the OFF-state of a high threshold voltage (HVT) NMOS transistor with L=0.09 μm in an exemplary NMOS transistor; the bulk current of a corresponding low threshold voltage (LVT) transistor in the OFF-state is also shown for comparison.
Figure 2:
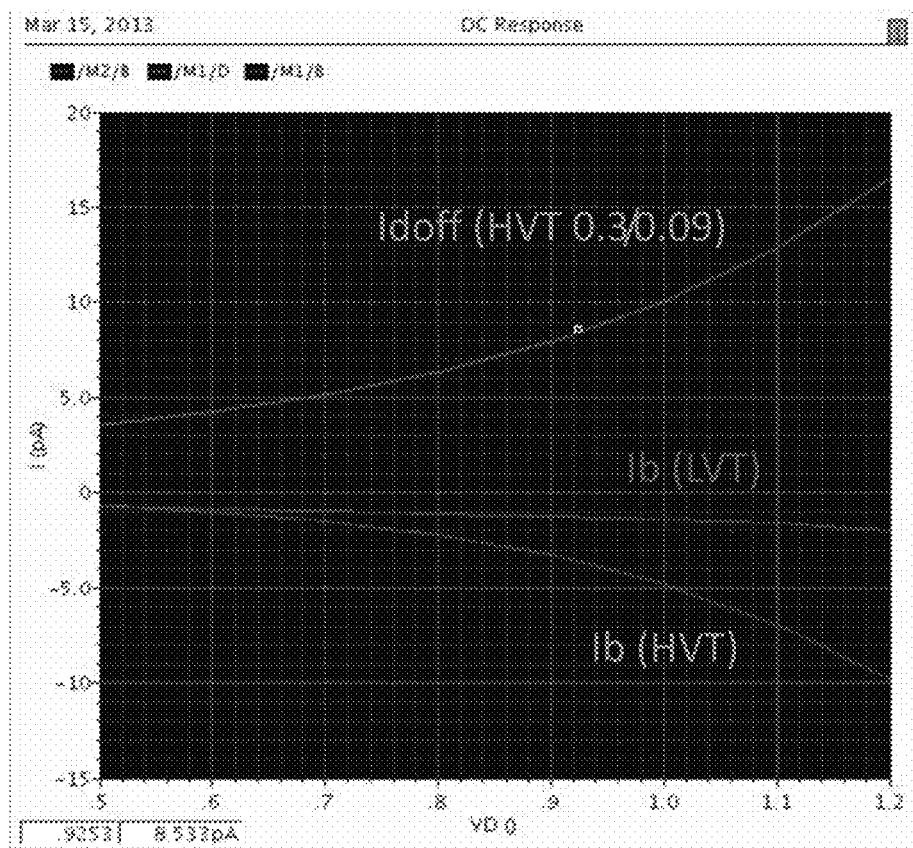
Figure 3A:
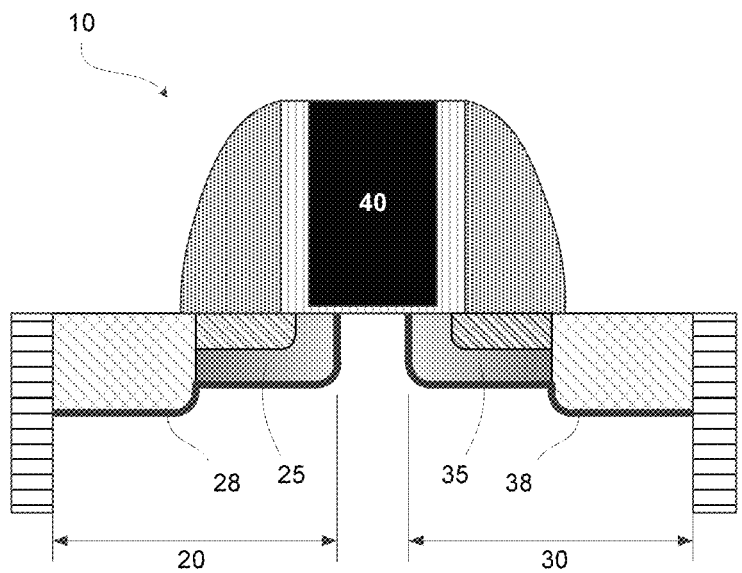
FIG. 3A depicts the cross section of a standard HVT transistor known in the art.
Figure 3B:
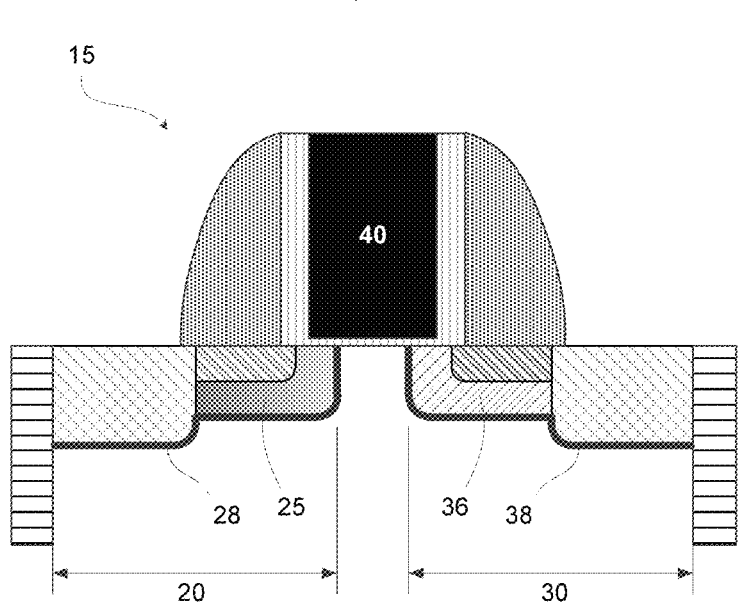
FIG. 3B depicts the cross section of an asymmetric transistor with an LVT pocket & extension implant on the drain terminal according to an embodiment of the present invention.

FIG. 3A shows a thin gate-oxide transistor 10 in which the source region 20 is fabricated with a pocket implant 25. The drain region 30 of the transistor 10 is similarly fabricated with a pocket implant 35. Conventionally, the source and drain regions are implanted with the same masking step, and the implantation results in an extension of either region (see regions 25 and 35 in FIG. 3A). The resulting pocket implant and extension are coupled together for each of the source and drain regions. With reference to FIG. 3A, an embodiment of the present invention is shown in FIG. 3B in which the doping of the extension and pocket implant 25 in the source region 20 is different to that of the extension and pocket implant 36 of the drain region (as indicated by the different shading for regions 35 and 36 in FIGS. 3A and 3B).

Standard CMOS fabrication technologies use multiple pocket and extension implants to realise a desired threshold voltage VT. In the conventional transistor of FIG. 3A, the same implant steps on the source 20 and drain 30 regions of the transistor 10 are used.

For transistors powered in the Sleep mode, greater than minimum channel length can be used in CMOS logic cells to reduce leakage with small impact on the die size. This also makes it possible to place the edge of an implant mask on the centre of the gate 40, therefore allowing for the fabrication of the transistor 10 with source 20 and drain 30 regions comprising different doping levels. Transistor 15 of FIG. 3B is fabricated according to an embodiment of the present invention in which the drain region 30 has a different doping to the corresponding source region 20 of the device such that the junction profile and electrostatic barrier of the drain-channel junction 38 is different to that of the source-channel junction 28. In one embodiment of the present invention, the drain extension and pocket implant 36 has a lower doping than the corresponding source implant 25 of the device such that the junction leakage caused by band-to-band tunnelling on the drain-channel junction 38 is lower than that of the source-channel junction 28.

The drain junction 38 determines the junction leakage current, whereas the source junction 28 largely determines the transistor threshold voltage. The asymmetry illustrated in FIG. 3B therefore allows a CMOS device fabricated according to an embodiment of the present invention to have a highly doped and abrupt source-channel junction 28 to maintain high threshold voltage thus controlling the sub-threshold current, in combination with a soft drain junction using the pocket and extension implants 36 of a low threshold voltage (LVT) transistor to reduce junction leakage into the bulk 50.

As an alternative to LVT implants 36 on the drain side 30, in a further embodiment, light pocket and extension implants commonly used for I/O transistors could be used.

In accordance with an embodiment of the present invention, an LVT implant 36 is used at the drain terminal 30; the reduced junction leakage due to the LVT implant 36 at the drain region 30 allows a further reduction of the overall leakage at longer channel length than is possible with HVT transistors.

Conventionally, terminal implantation of CMOS transistors is performed using ¼ of the total implant dose to implant the required area four times, each of the ¼ doses being performed after rotating the semiconductor wafer 90 degrees. As an alternative, implants using a 180 degree rotation of the wafer with respect to the implant beam (½ of the total dose implanted for each rotation) can be used instead of conventional quad-implants (90 degree rotation for each ¼ of the total implant dose). Transistors resulting from these dual-implants cannot be rotated 90 degrees on the layout, however they have lower leakage.

The present invention presents a placement architecture to facilitate issues of implementing logic standard cells using asymmetrically doped CMOS transistors.

In a device layout using cell libraries based on standard CMOS design rules for active circuitry, the standard-cell area providing the keep-alive functionality in the Sleep mode, using the asymmetric transistors 15 of the present invention, can be clearly recognised as having a gate pitch that is significantly larger than the areas using a high-density standard cell library, yet being significantly more compact than areas using cell libraries based around the design rules of standard I/O transistors. This keep-alive circuitry is further characterised by having fully aligned and regular edges of the gates and active areas in the channel direction as well as by having always exactly one gate per active area, rather than sharing one active area for multiple transistors.

An integrated circuit die may contain a majority of symmetrical CMOS transistors in standard cells with L<1.5× Lmin in the chip area powered in the active mode, and a fraction, typically less than ¼ of the total gate count, will comprise asymmetrically doped transistors to provide the keep-alive functionality in the Sleep mode.

The asymmetrically doped transistors of the present invention are fabricated using the same CMOS technology used to fabricate the symmetrical transistors. This allows the Always-ON and non-Always-ON transistors to be fabricated together and on the same substrate, thereby requiring no separate fabrication steps. In order to achieve this, a unique CMOS layout is required, as will be detailed below.

Figure 4:
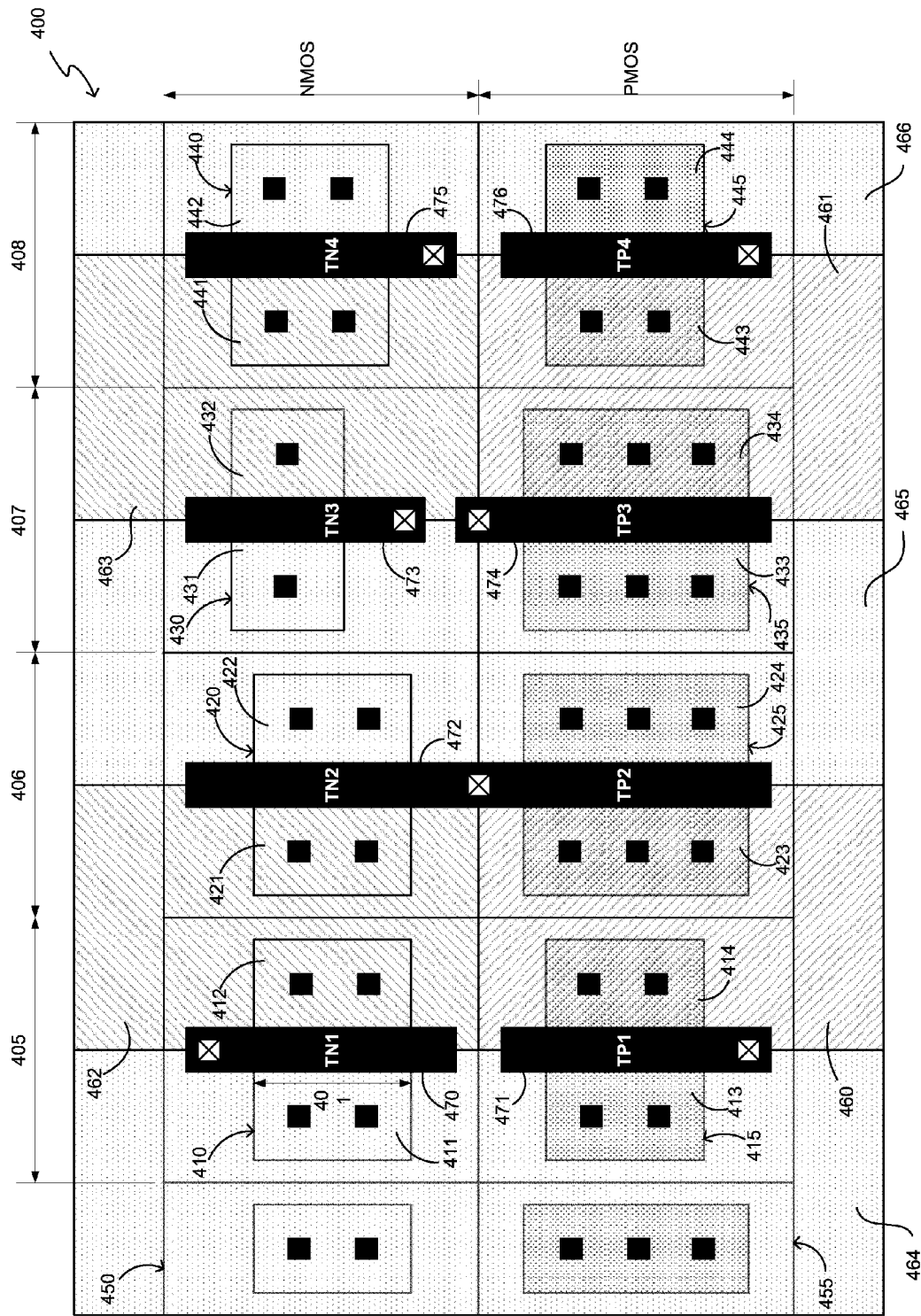
FIG. 4 illustrates a schematic layout exemplifying base cell patterns for the fabrication of asymmetric transistors according to an embodiment of the present invention.

A CMOS layout 400 for the fabrication of asymmetric transistors according to an embodiment of the present invention is shown in FIG. 4. The example CMOS layout 400 in FIG. 4 shows four asymmetric NMOS transistors TN1, TN2, TN3 and TN4, and four asymmetric PMOS transistors TP1, TP2, TP3 and TP4. However any number of such transistors, and, preferably, an equal number of transistors in which there are as many asymmetric NMOS transistors as there are asymmetric PMOS transistors, may be used.

In one embodiment of the present invention, asymmetric NMOS and PMOS transistors are abutted together in a CMOS layout 400 as shown in FIG. 4. In the CMOS layout 400 of FIG. 4, regions 411, 422, 431 and 442 are the source regions of the asymmetric NMOS transistors 410, 420, 430 and 440, respectively, and regions 412, 421, 432 and 441 are the drain regions of the asymmetric NMOS transistors 410, 420, 430 and 440, respectively. Regions 413, 424, 433 and 444 are the source regions of the asymmetric PMOS transistors 415, 425, 435 and 445, respectively, and regions 414, 423, 434 and 443 are the drain regions of the asymmetric PMOS transistors 415, 425, 435 and 445, respectively.

FIG. 4 also shows four example base patterns 405, 406, 407 and 408. The construction of all base patterns is based on a regular pattern for the pocket and extension implants 410, 415, 420, 425, 430, 435, 440 and 445, which comply with the normal design rules for minimum edge-length and minimum area required for viable implants in the CMOS technology. The minimum allowed edge length for the implant opening defines the transistor pitch. Each base cell contains one NMOS and one PMOS transistor, whereby the each transistor has an individual active Silicon area and all edges of gate and active area are aligned in the channel direction of the transistor. Each implant area 464 to 466 is shared between the source areas of two adjacent base cells; each implant area 460 to 463 is shared between the drain areas of two adjacent base cells. This implies a pattern of even and odd base patterns where all odd base patterns are mirrored along a vertical axis. In an alternative embodiment of the present invention, implant areas 464 to 466 is shared for the drain areas of two adjacent base cells while each implant area 460 to 463 is shared between the source areas of two adjacent base cells.

The four base cell patterns shown vary only in the number and location of gate connections as well as in the gate widths of the NMOS and PMOS transistors within the cell. Base cell 405 has separate gate connections for each of TN1 and TP1. Accordingly, contacts to the each gate are positioned a minimum allowed (vertical) distance away from the active regions of the device. In base cell 405, gate connections are made to the top of the NMOS transistor and to the bottom of the PMOS transistor. A single shared gate electrode with a centrally located gate contact is adopted in base cell 406, connecting the gates of transistors TN2 and TP2. Base cells 407 and 408 have separate gate connections for each of transistors TN3, TP3, TN4 and TP4, the contacts of each being located at different positions. It should be noted that transistors TN1 to TN4 and TP1 to TP4 have different gate widths (identified by the vertical length of overlap of the respective gate electrodes and the width of the active silicon area; this has been identified by dimension 401 in FIG. 4). It will be recognised that the above described variations in base cell patterns fall within the scope of the present invention.

Base cell 405 consists of an NMOS transistor 410 and a PMOS transistor 415 with the like terminals vertically aligned where the source region 411 of the NMOS transistor 410 is in line with the source region 413 of the PMOS transistor 415. In the CMOS layout 400, base cells are laterally mirrored such that the interior source and drain regions abut each other.

Region 460 is configured such that the edge of the photoresist mask vertically falls on the centre of gates 471 and 472. To ensure that the implant area 460 is not obstructed by photoresist a minimum overlap of the gate is required, typically requiring a gate length of at least 1.5×Lmin. Similarly, the edges of the photoresist mask defining regions 461 to 463 fall on the centre of gates 474 and 476, 470 and 472, and 473 and 475, respectively, thereby ensuring that the photoresist can be fully removed between these gates to enable the implantation. This results in the source and drain regions of each of the asymmetric NMOS or PMOS transistors having different junctions. In one embodiment of the present invention, the drain region has a lower doping than the source region in each asymmetric transistor.

In the above described embodiments, the mirroring of the base cells in the CMOS layout 400 complies with minimum implant area rules such that the area between regions 460 to 463, for example, remains viably implanted to realise regions of higher doping; this is achieved by ensuring that the width of the implant mask openings defining regions 460 to 463 complies with the minimum width for pocket and extension implantation defined by the CMOS technology used for fabrication of the symmetrical transistors. It can be seen that the advantage of this asymmetric CMOS transistor placement methodology is that the loss of gate density forced by the requirements of the different implantation of source and drain is minimised and a regular placement is adopted, which minimises the variation in the layout environment of each transistor and the number of viable base cells. The limited number of fixed base cells allows these to be better characterised and modelled by precise fixed point models rather than fully scalable models including extensions to account for some of the variations caused by the local environment.

Further, in the embodiments described above, within each base cell, no ohmic contact is made to the respective n-wells and p-wells in which the respective NMOS and PMOS transistors are located. This ensures a higher packing density of cells giving a higher density of gate electrodes per unit area. In an embodiment of the present invention, dedicated tap-cells 450 and 455 are inserted at the end of a row of asymmetric transistors, as seen in FIG. 4. These tap cells are defined to receive either the source or the drain implants.

Figure 5A:
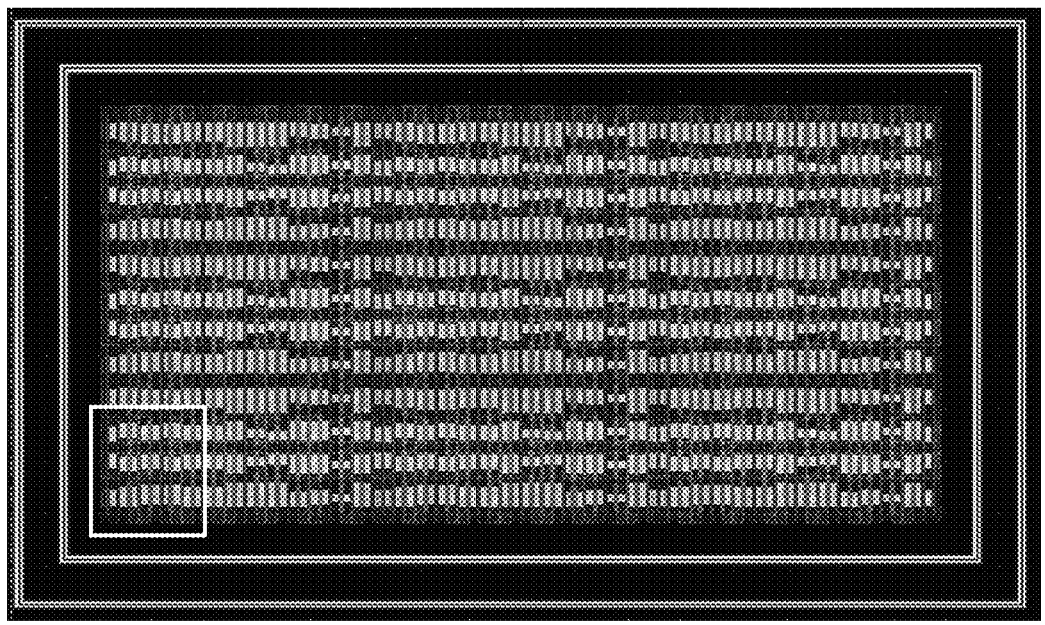
FIGS. 5A and 5B illustrates an example CMOS layout for the fabrication of asymmetric transistors according to an embodiment of the present invention.
Figure 5B:
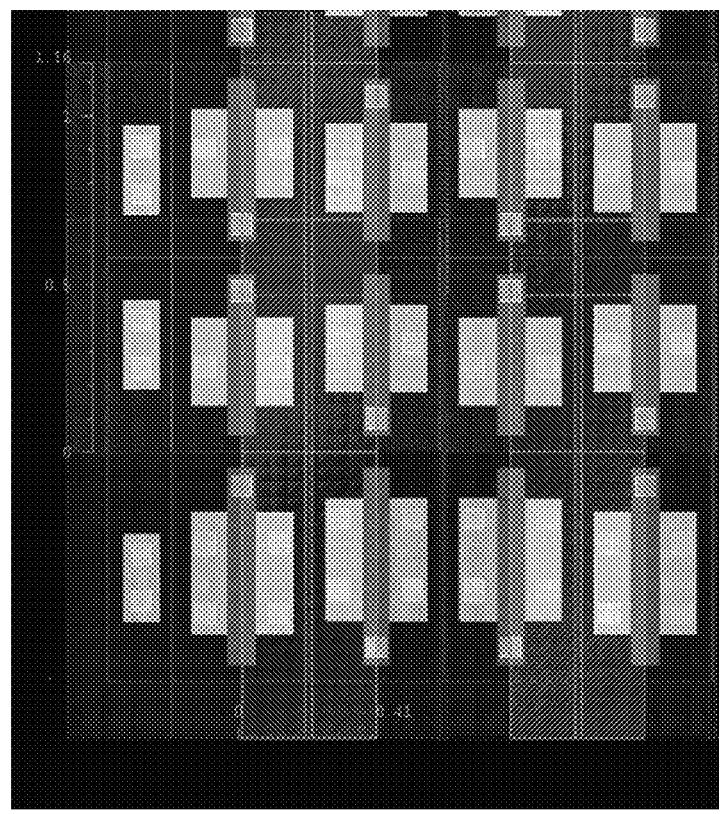

In a further embodiment of the present invention, when tap-cells comply with area rules of the CMOS technology used for fabrication, they can be used at the edges of logic cells, as shown in the CMOS layout in FIGS. 5A and 5B. In this manner, and in accordance with an embodiment of the present invention, the height of the base patterns can be aligned to conventional standard cells, such as a 9 track cell height, and can be butted to conventional standard cells without the need for border dummy cells.

In one example based on 40 nm CMOS technology, according to layout design rules, the minimum implant width is 0.18 µm and the minimum diffusion extension in the lateral (source/drain) direction is 0.14 µm. This gives a minimum lateral gate extension of 0.08 µm (because Lmin=2×(0.18 µm−0.14 µm)=0.08 µm). For a base cell height of 1.26 µm in which the NMOS transistor height is 0.58 µm and the PMOS transistor height is 0.68 µm, and a base cell width of 0.4 µm, the unit implant area for an NMOS asymmetric transistor is 0.232 µm$^2$ while that for a PMOS asymmetric transistor is 0.272 µm$^2$.

The increased gate area and reduced net channel doping reduces the threshold voltage variability of the resulting asymmetric transistor, and therefore allows these transistors to operate at less gate-overdrive, i.e. reduced supply voltage. This allows the supply voltage to be reduced during sleep mode in which only the keep-alive circuitry is powered and active.

Preferably the transistors of the present invention are fabricated with existing pocket and extension implants used for different types of symmetric core logic, SRAM or I/O transistors in the CMOS process technology.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A method of arranging asymmetrically doped CMOS transistors in a semiconductor wafer, said method of arrangement forming base cells within a plurality of logic standard cells in a CMOS process technology comprising conventional, symmetric CMOS transistors having different threshold voltages distinguished by junction implants forming the electrical junctions directly adjacent to the gate;
   said asymmetrically doped CMOS transistors having a gate length exceeding 1.5 times the minimum gate length of the symmetric CMOS transistors, whereby the regions defined by the electrical junctions directly adjacent to the gate of the asymmetric transistors are formed by:
      an implant mask from a plurality of implant masks that exposes an area of the wafer on the source side of the transistor to receive the junction implant of the symmetric CMOS transistors with higher threshold voltage while shielding the drain area, and
      a further implant mask from said plurality of implant masks that exposes an area of the wafer on the drain side of the transistor to receive the junction implant of the symmetric CMOS transistors with lower threshold voltage while shielding the source area;
   said asymmetrical transistors being arranged into base cells such that patterns for source and drain regions formed on the relevant implant masks form a regular array which is achieved by mirroring adjacent base cells such that like regions of source or drain are directly adjacent for each pair of base cells;
   wherein each base cell contains exactly one asymmetric NMOS transistor and one asymmetric PMOS transistor, each formed on an individual active area, such that the gate and vertical position of the active area are aligned between said NMOS and PMOS transistors and such that the edges of the relevant implant masks forming each of the electrical junctions adjacent to the gate are aligned with the centre of the gate.

2. The base cells of claim 1, wherein the area of the implant patterns that define the junction implants directly adjacent to the transistor gate exceeds 50% of the minimum area required for a viable implant in the CMOS process technology.

3. A plurality of base cells according to claim 1 with identical implant patterns differing only by the width of the NMOS and PMOS transistors as well as by the configuration of the gate connection.

4. A pair of tap cells having the same size and type of implant opening for the implant defining the transistor junctions directly adjacent to the transistor gates according to claim 1, wherein one of the pair of tap cells is used for the source side, and the other of the pair of tap cells is used for the drain side, said pair of tap cells containing a source-drain implant of opposite type to that of the junction directly adjacent to the transistor gate and forming an ohmic connection to the transistor bulk.

* * * * *